United States Patent [19]
Hashizume et al.

[11] Patent Number: 5,256,900
[45] Date of Patent: Oct. 26, 1993

[54] PACKAGE FOR SEMICONDUCTOR DEVICE WITH AT LEAST ONE THROUGH HOLE

[75] Inventors: Shoji Hashizume; Masayoshi Nasu, both of Tokyo, Japan

[73] Assignee: NEC Corporation, Tokyo, Japan

[21] Appl. No.: 703,268

[22] Filed: May 22, 1991

[30] Foreign Application Priority Data

May 22, 1990 [JP] Japan .................. 2-131822

[51] Int. Cl.$^5$ ............................. H01L 23/02
[52] U.S. Cl. .................. 257/678; 257/693; 257/692; 361/829
[58] Field of Search ............ 357/72, 74, 70; 257/693, 692, 678, 705, 704, 676, 703, 720, 675; 361/380, 417, 419, 429

[56] References Cited

U.S. PATENT DOCUMENTS

| | | | |
|---|---|---|---|
| 4,918,511 | 4/1990 | Brown | 257/676 |
| 4,942,454 | 7/1990 | Mori et al. | 357/72 |
| 4,952,999 | 8/1990 | Robinson et al. | 257/676 |
| 5,018,004 | 5/1991 | Okinaga et al. | 357/74 |
| 5,036,584 | 8/1991 | Beauregard et al. | 357/74 |
| 5,063,434 | 11/1991 | Emoto | 357/70 |

FOREIGN PATENT DOCUMENTS

1-209751  8/1989  Japan .

*Primary Examiner*—William Mintel
*Assistant Examiner*—Roy Potter

[57] ABSTRACT

A package for semiconductor devices formed by brazing a metallic frame and an insulating substrate having metallized patterns for electrically connecting the electrodes of semiconductor elements mounted thereon to the outside, which can reduce the warp in the package generated during the brazing assembly due to the difference in the coefficients of thermal expansion, and can reduce the cracks in the insulating substrate that tend to be created during the brazing assembly due to the thermal stresses. Through holes are drilled in the metallic frame in more than at least one place of the metallic frame.

3 Claims, 4 Drawing Sheets

PACKAGE FOR SEMICONDUCTOR DEVICE WITH AT LEAST ONE THROUGH HOLE

BACKGROUND OF THE INVENTION

The present invention relates to a package for semiconductor devices, and more particularly, to a package for semiconductor devices formed by brazing an insulating substrate and a metallic frame.

DESCRIPTION OF THE PRIOR ART

An example of a package for semiconductor devices of the above kind has a structure as shown in FIG. 1, wherein FIG. 1(a) is a top view and FIG. 1(b) is a vertical sectional view taken along the line X—X' in FIG. 1(a). FIG. 1(c) shows a bottom view of FIG. 1(a). Such a prior art semiconductor device has an insulating substrate 301 made of a ceramic such as alumina, beryllium, AlN, on which are provided a mounting metallized pattern 301-1 for fixing and grounding semiconductor elements, a sealing metallized pattern 301-2 for cap-sealing, an outwardly leading metallized pattern 301-4 for leading out the electrodes of the semiconductor elements to the outside, and the like. In addition, the insulating substrate 301 has lead-out leads 305 for leading out the electrodes of the semiconductor elements to the outside and a metallic frame 302 for grounding the semiconductor elements, brazed using a brazing material 306 such as an Ag-Au alloy or an Au-Ge alloy.

Further, the metallic frame 302 is connected to the grounding leads 302-1 for ensuring the grounding of the semiconductor device, and the metallic frame 302 and the lead-out leads 305 are fixed by brazing to a frame brazing metallized pattern 301-8 and a lead brazing metallized pattern 301-7, respectively. Moreover, the lead brazing metallized pattern 301-7 is electrically connected to the outwardly leading metallized pattern 301-4 via outwardly leading through holes 301-6. Similarly, the frame brazing metallized pattern 301-8 is electrically connected to the mounting metallized pattern 301-1 via grounding through holes 301-3 for reducing the grounding inductance of the mounted semiconductor elements.

Moreover, side face metallized patterns 301-5 are formed on the side faces of the insulating substrate 301 for the purpose of increasing the brazing strength of the lead-out leads 305.

The metallized patterns on the insulating substrate 301 described above are ordinarily formed by the use of W or Mo-Mn, and they are connected by brazing after subjected to an Ni plating or the like in order to increase the wettability of the brazing material 306.

Moreover, such a package for semiconductor devices is used after carrying out a corrosion proof plating (for example, applying an Au plating after an Ni plating) after brazing assembly for the purpose of enhancing the assembly workability (namely, mounting, bonding, airtight sealing, and the like) of the semiconductor devices.

In such a prior art package for semiconductor devices, a metallic frame is brazed to an insulating substrate using a brazing material such as an Ag-Cu alloy. Because of this, there was a problem that a warp is generated in the package for semiconductor devices during the brazing assembly of the insulating substrate and the metallic frame due to the difference in the coefficients of thermal expansion, or that cracks tend to occur in the insulating substrate due to stresses generated during the brazing assembly.

These problems result in such defects as the deterioration in the assembly yield of the semiconductor devices caused by the warp in the package that obstructs the sealing performance of the cap, and the deterioration of the reliability of the semiconductor devices due to the cracks that tend to be created, under the usage environment of the semiconductor devices, by the stresses generated during the brazing assembly.

SUMMARY OF THE INVENTION

It is, therefore, an object of the present invention to provide a package for semiconductor devices which can reduce the warp of the package for the semiconductor devices, warp which are generated during brazing an insulating substrate and a metallic frame.

It is another object of the present invention to provide a package for a semiconductor device which can eliminate the problem that cracks tend to be generated in the insulating substrate due to the stresses generated during the brazing assembly.

According to the present invention, there is obtained a package for semiconductor devices formed by brazing a metallic frame and an insulating substrate having semiconductor elements mounted thereon and being provided with metallized patterns for electrically connecting the electrodes of said semiconductor elements to the outside characterized in that at least one through hole is provided in the metallic frame.

BRIEF DESCRIPTION OF THE DRAWINGS

The above and further objects, features and advantages of the present invention will become more apparent from the following detailed description taken in conjunction with the accompanying drawings, wherein:

FIG. 1(a) shows a top view of the device, FIG. 1(b) shows a vertical sectional view taken along the line X—X' indicated in FIG. 1(a) and FIG. 1(c) is bottom view of the device;

FIGS. 2(a) and 2(h) show an embodiment of the present invention, where FIG. 2(b) shows a bottom view of the embodiment and FIG. 1(a) shows a vertical sectional view taken along the line X—X' indicated in FIG. 2(b); FIG. 3(a) shows a bottom view of the embodiment and FIG. 3(a) shows a vertical sectional view taken along the line X—X' indicated in FIG. 3(b).

DESCRIPTION OF THE PREFERRED EMBODIMENTS

Figure 1A:
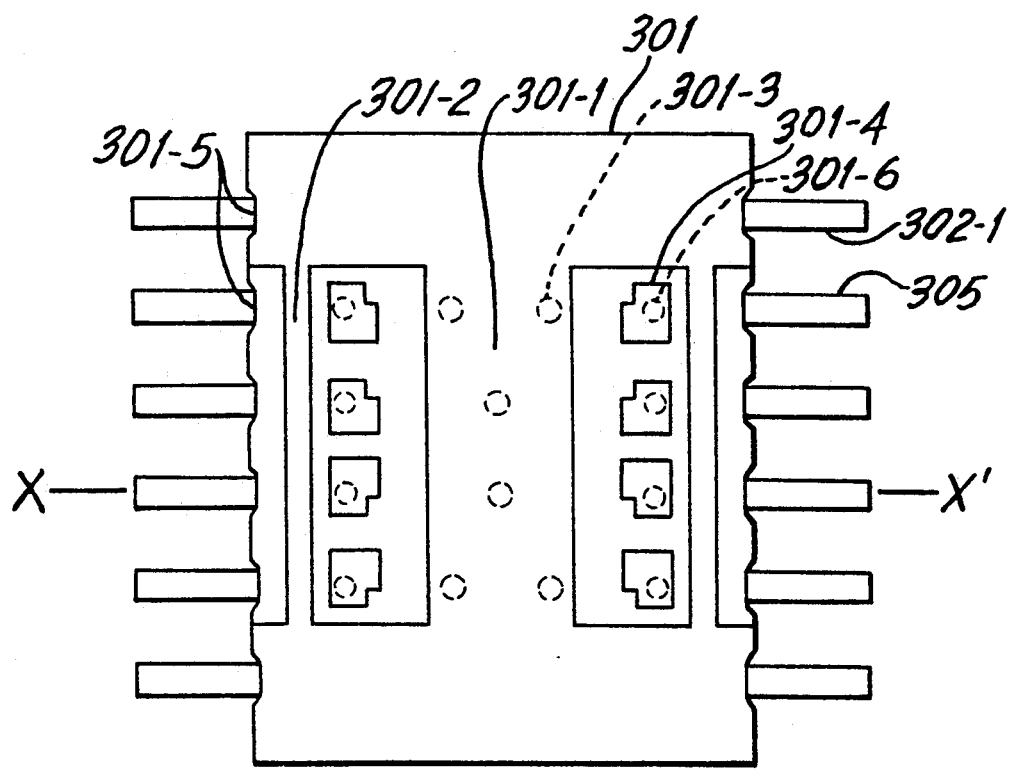
FIGS. 1(a) to 1(c) show an example of the prior art package for semiconductor devices, where
Figure 1B:
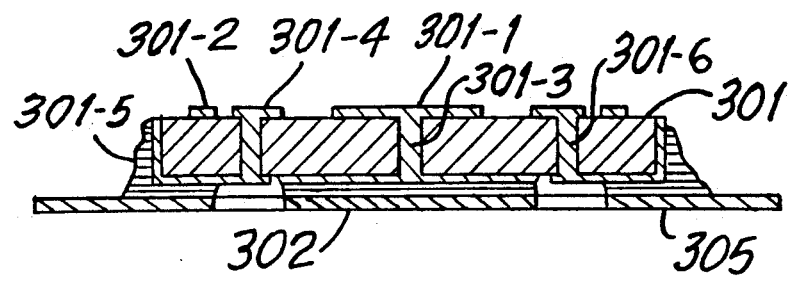
Figure 1C:
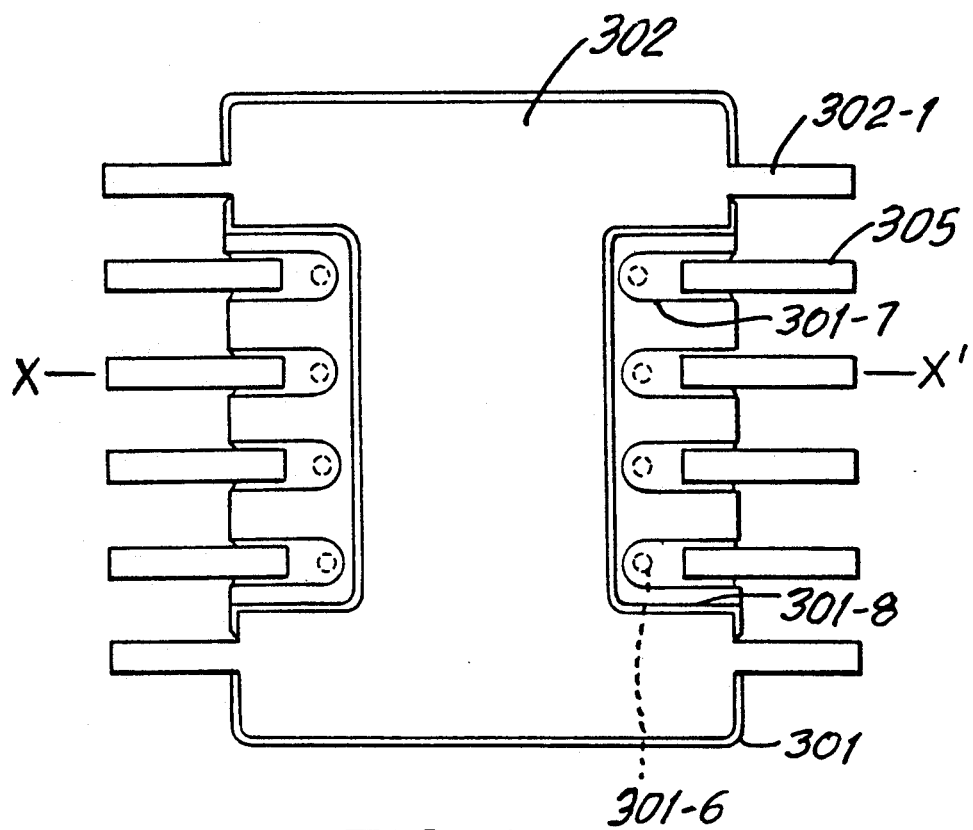

Next, referring to the drawings, the present invention will be described.

Figure 2A:
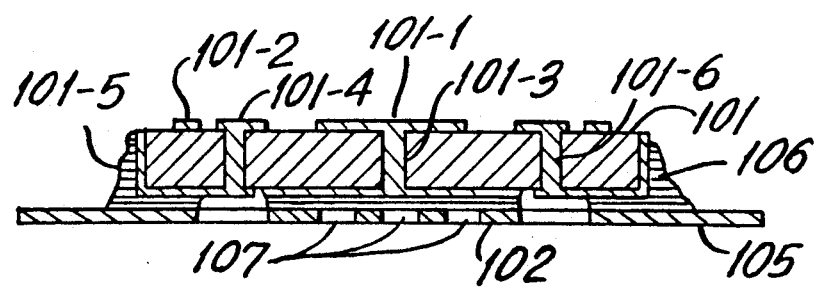
Figure 2B:
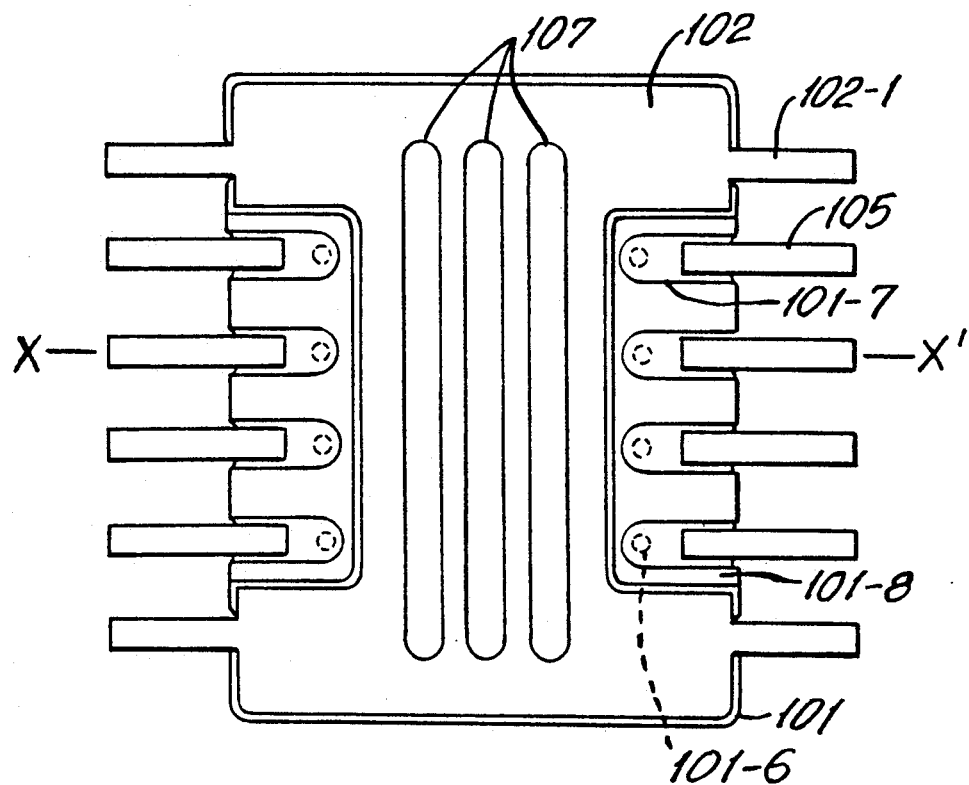

FIG. 2 is a package for semiconductor devices showing an embodiment of the present invention wherein FIG. 2(b) is its bottom view and FIG. 2(a) is its vertical sectional view taken along the line X—X' in FIG. 2(b).

As shown in FIG. 2, the package for semiconductor devices in accordance with the present invention has an insulating substrate 101 made of a ceramic such as alumina, beryllia, AlN on which are provided a mounting metallized pattern 101-1 for fixing and grounding semiconductor elements, a sealing metallized pattern 101-2 for cap sealing, an outwardly leading metallized pattern 101-4 for outwardly leading the electrodes of the semiconductor elements. In addition, the insulating substrate 101 has lead-out leads 105 for leading the electrodes of the semiconductor elements to the outside and a metallic frame 102 for grounding the semiconductor elements, that are brazed to the insulating substrate 101 via a brazing material 106 such as an Ag-Cu alloy or an Au-Ge alloy.

Further, the metallic frame 102 is connected to the grounding leads 102-1 for ensuring the grounding of the semiconductor device, and the metallic frame 102 and the lead-out leads 105 are fixed by brazing to a frame brazing metallized pattern 101-8 and a lead brazing metallized pattern 101-7, respectively. Moreover, the lead brazing metallized pattern 101-7 is electrically connected to an outwardly leading metallized pattern 101-4 via outwardly leading through holes 101-6. Similarly, the frame brazing metallized pattern 101-8 is electrically connected to the mounting metallized pattern 101-2 via grounding through holes 101-3 for reducing the grounding inductance of the mounted semiconductor elements.

Here, the metallic frame 102 is provided with elongated, warp-reducing through holes 107 that are drilled in the metallic frame 102. In addition, side face metallized patterns 101-5 are generally provided for the purpose of reinforcing the brazing strength of the lead-out leads 105. Moreover, the metallized patterns on the insulating substrate 101 are ordinarily provided using W or Mo-Mn, which are connected to the substrate by brazing after subjecting them to Ni plating or the like to improve the wettability of the brazing material 106.

Figure 3A:
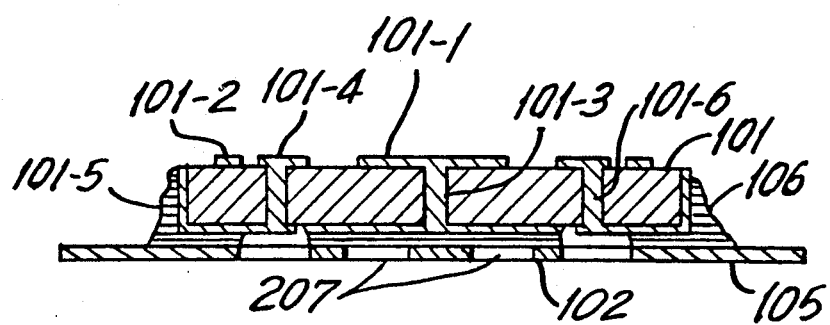
FIGS. 3(a) and 3(b) show another embodiment of the present invention, where
Figure 3B:
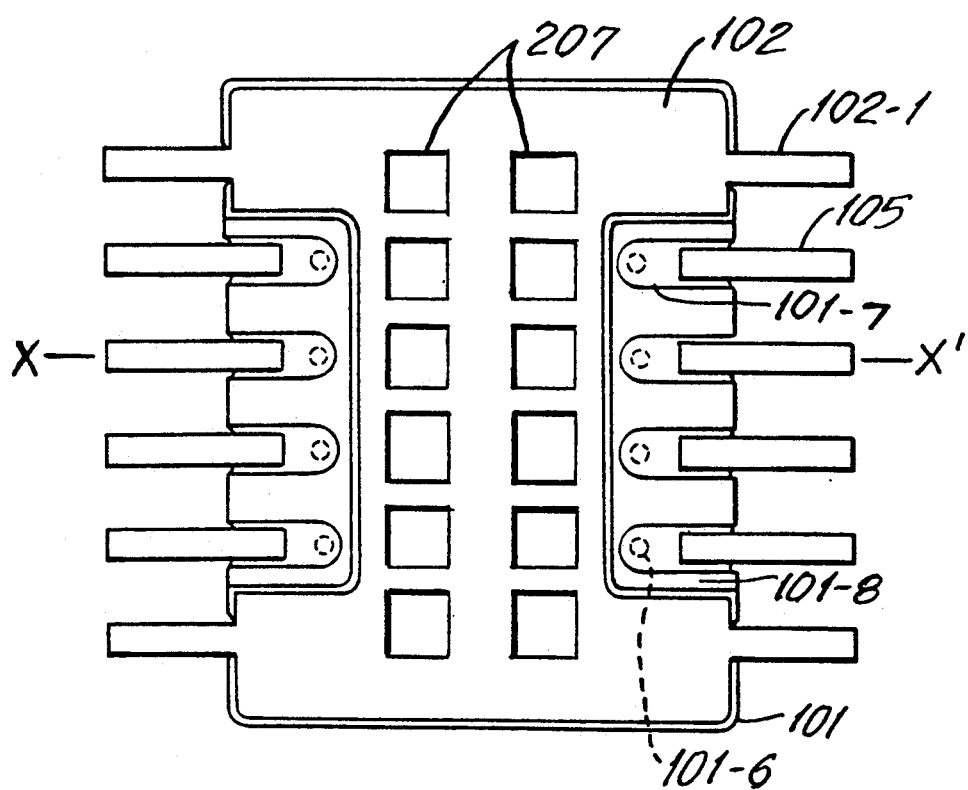

In FIG. 3 which shows another embodiment of the package for semiconductor devices in accordance with the present invention, FIG. 3(b) shows its bottom view and FIG. 3(a) shows a vertical sectional view taken along the line X—X' in FIG. 3(b).

Analogous to FIG. 2, FIG. 3 shows that a metallic frame 102 which is connected to grounding leads 102-1 and lead-out leads 105 are brazed via a brazing material 106 to an insulating substrate 101 on which are provided a mounting metallized part 101-1, a sealing metallized part 101-2, grounding through holes 101-3, an outwardly leading metallized pattern 101-4, a side face metallized part 101-5, outwardly leading through holes 101-6, a lead brazing metallic pattern 101-7 and a frame brazing metallic pattern 101-8. In this embodiment, warp reducing through holes 207 for the package are drilled in the metallic frame 102 in the form of a square.

Next, the result of a comparison of the amount of warp, the rate of crack generation in the insulating substrate and the situation of crack generation in the insulating substrate due to thermal stresses (caused by the temperature switching between −65° and +200° C.) for the conventional package for semiconductor devices and the package for semiconductor devices according to the present invention for samples with identical shape and under identical conditions.

TABLE 1

Result of Comparison for Warp in Package for Semiconductor Devices and Generation of Cracks in Insulating Substrate
(Size of insulating substrate (alumina): 5 mm width × 7 mm length × 0.254 mm thickness)

| Test Item | | Package for Semiconductor Devices of Prior Art | Package for Semiconductor Devices of Present Invention |
|---|---|---|---|
| 1. Amount of Package Warp (n = 10 pcs) | | 30–130 μm | 10–45 μm |
| 2. Cracks in Insulating Substrate after Brazed Assembly | | in 3 out of 100 pcs | in 0 out of 500 pcs |
| 3. Cracks in Insulating Substrate due to Thermal Stresses (−65° C. ⟷ +200° C.) | After 10 cycles | in 3 out of 20 pcs | in 0 out of 20 pcs |
| | After 50 cycles | in 5 out of 20 pcs | in 0 out of 20 pcs |
| | After 100 cycles | in 7 out of 20 pcs | in 0 out of 20 pcs |
| | After 500 cycles | in 9 out of 20 pcs | in 0 out of 20 pcs |

From Table 1 it can be seen that the package for semiconductor devices according to the present invention has smaller amount of warp and fewer cracks in the insulating substrate after package assembly, compared with the conventional package for semiconductor devices, making it possible to obtain a package that has high reliability.

As described in the above, the present invention is capable of reducing the warp and stresses in the package for semiconductor devices that are generated during the brazing assembly of an insulating substrate and a metallic frame due to the difference in the coefficients of thermal expansion, by providing through holes in the metallic frame. Moreover, it is also possible to eliminate the problem that cracks tend to be generated in the insulating substrate due to the stresses generated during the brazing assembly.

Various modifications will become possible for those skilled in the art after receiving the teachings of the present disclosure without departing from the scope thereof.

What is claimed is:

1. A package for semiconductor devices comprising:
    a semiconductor element;
    an insulated substrate having first and second main surfaces opposed to each other and a through hole;
    a plurality of metallized lead patterns formed on said first main surface;
    a metallized mounting pattern formed on said first main surface to mount said semiconductor element thereon, said metallized mounting pattern extending through said through hole to said second main surface; and
    a metallic frame brazed to said metallized mounting pattern on said second main surface of said insulating substrate by a brazing material, said metallic frame having at least one through hole at a location under said semiconductor element to expose said brazing material and thereby reduce warping of the package.

2. A package for semiconductor devices according to claim 1, wherein said at least one through hole in said metallic frame has a square shape.

3. A package for semiconductor devices according to claim 1, wherein said at least one through hole in said metallic frame is elongated.

* * * * *